(12) United States Patent
Asa

(10) Patent No.: US 7,068,132 B2  
(45) Date of Patent: Jun. 27, 2006

(54) COMPACT MAGNETIC INDUCTION SWITCH

(75) Inventor: Yuhikiro Asa, Tokyo (JP)

(73) Assignee: ASA Electronic Industry Co., LTD., Tokyo (JP)

( * ) Notice: Subject to any disclaimer, the term of this patent is extended or adjusted under 35 U.S.C. 154(b) by 75 days.

(21) Appl. No.: 10/783,261

(22) Filed: Feb. 19, 2004

(65) Prior Publication Data

US 2004/0263296 A1    Dec. 30, 2004

Related U.S. Application Data

(63) Continuation of application No. 10/246,598, filed on Sep. 18, 2002, now Pat. No. 6,771,155.

(30) Foreign Application Priority Data

Nov. 8, 2001 (JP) ............................. 2001-343194

(51) Int. Cl.  
*H01H 9/00*    (2006.01)

(52) U.S. Cl. .................................................. 335/205

(58) Field of Classification Search ......... 335/205–208  
See application file for complete search history.

(56) References Cited

U.S. PATENT DOCUMENTS

| | | | |
|---|---|---|---|
| 3,673,526 A | | 6/1972 | Brevick |
| 3,838,316 A | * | 9/1974 | Brown et al. ................ 361/679 |
| 3,873,957 A | * | 3/1975 | Wurscher et al. ......... 338/32 H |
| 4,346,360 A | | 8/1982 | Del Tufo |
| 5,057,807 A | * | 10/1991 | Longly et al. ............... 335/207 |
| 5,656,982 A | | 8/1997 | Kurahara |

FOREIGN PATENT DOCUMENTS

| | | |
|---|---|---|
| JP | 07-105809 | 4/1995 |
| JP | 2003-016893 | 1/2003 |

\* cited by examiner

*Primary Examiner*—Ramon M. Barrera  
(74) *Attorney, Agent, or Firm*—Hickman Palermo Truong & Becker, LLP; Kirk D. Wong

(57) ABSTRACT

An extremely compact low cost magnetic induction switch which may be activated by an extremely small operation force (approximately 1 g) has a movable member (2) and a coil spring (3) arranged inside a switch case (1), the spring coil (3) supporting the movable member (2), and the movable member protruding from an opening (1D) of an upper surface portion of the switch case (1). A Hall IC (4) is arranged in a switch case (1). When the upper portion is pushed, a magnet (6) fixed to the movable member (2) moves downward so that an output signal of the Hall IC (4) is changed from OFF to ON.

17 Claims, 8 Drawing Sheets

COMPACT MAGNETIC INDUCTION SWITCH

CROSS-REFERENCES TO RELATED APPLICATIONS

This application is a continuation of U.S. patent application Ser. No. 10/246,598 filed Sep. 18, 2002 now U.S. Pat. No. 6,771,155, the entire contents of which are incorporated herein by this reference, and which claims priority to JAPAN 2001-343194 filed Nov. 8, 2001.

BACKGROUND OF THE INVENTION

1. Field of the Invention

The present invention relates to a non-contact type compact magnetic induction switch capable of being switched ON and OFF by a slight operating force.

2. Description of the Related Art

As for a conventional compact switch, there are available a mechanical contact type switch and a proximity switch utilizing an oscillator. However, the contact type switch has its limit in making the operating force small, and further miniaturization thereof is difficult. While, the proximity switch is complicated in its structure, and has its limit in reducing the cost.

Further, a hole effect type position sensor which combines a permanent magnet and a hole element is used as position detection means for various types of equipment. This position sensor attaches the permanent magnet to a detected body whose position is desired to be detected so that magnetic field generating portions are constituted and, at the same time, a magnetic detection portion comprising the hole element is constituted so as to be relatively displaced against these magnetic field generating portions. When the magnetic field generating portions come close to the magnetic field detection portion, the hole element of the magnetic field detection portion detects the magnetic field from the magnetic generating portions by means of the hole effect and outputs an electrical signal, thereby detecting the position of the detected body. The hole effect type position sensor which constitutes such a hole element as the magnetic field detection portion does not have a mechanical contact such as a micro switch and the like, and has the advantages of being highly reliable in operating in non-contact on the detected body and, hence, is adopted in a wide range of applications.

Since the object of the sensor is to detect the position, though a measure for improving position detection accuracy is taken, using the sensor as a compact switch is not taken into consideration. Therefore, improving the function of the sensor as the compact switch is not taken into account.

SUMMARY OF THE INVENTION

The object of the present invention is to provide an ultra compact magnetic induction switch, whose operating force is made as small as possible and whose size is made as compact as possible.

Additionally, the above described object is realized by the compact magnetic induction switch comprising: a switch case; a movable member provided on an opening of the switch case and being reciprocally movable; an elastic body which is installed inside the switch case and urges an end portion of the movable member so as to be protruded outside of the switch case; a magnet fixed to the movable member; and a hole IC for detecting change of magnetic field caused by movement of the movable member with its operating point, wherein if the magnet field applied to the operating point of the hole IC becomes above or below a threshold by movement of the movable member, output signal of the hole IC switches on/off.

In the compact magnetic induction switch of the present invention, the positioning portion which positions the hole IC at a predetermined position may be provided inside the switch case.

Alternatively, a guide portion which guides the movable member may be provided inside the switch case. A lid member which is fitted into the bottom of the switch case may be provided and an opening which derives the lead wire of the hole IC or an opening which injects a filling agent may be provided on the lid member.

DESCRIPTION OF THE PREFERRED EMBODIMENT

Figure 1:
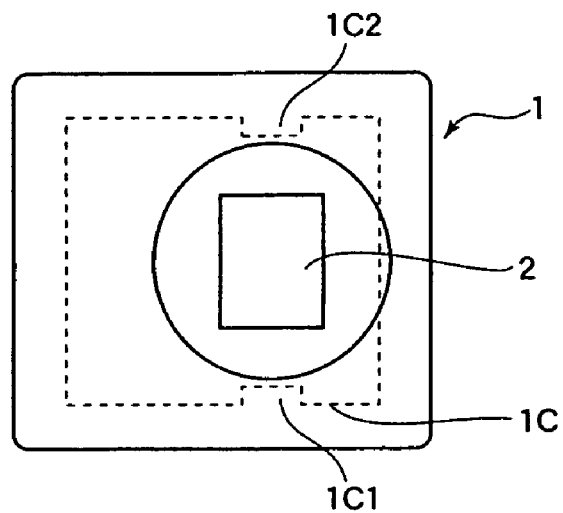
FIG. 1 is a plan view of one embodiment of a switch of the present invention.

One embodiment of a compact magnetic induction switch of the present invention is shown in FIGS. 1 to 8. In the drawings, reference numeral 1 denotes a switch case, reference numeral 2 a movable member, reference numeral 3 a spring coil, reference numeral 4 a hole IC, reference numeral 5 an output lead wire thereof and reference numeral 6 a permanent magnet, for example, such as a rare earth magnet.

The switch case 1, as shown in FIGS. 2 to 8, has a chamber 1a, in the interior of which are stored the movable member 2, the spring 3 and the Hall IC 4. In the chamber 1a, there are a positioning portion 1b and a guide portion 1c integrally provided with the switch case, and the positioning portion 1b comprises three pieces of positioning portions 1b1 to 1b3. The guide portion 1c has rail-shaped guide members 1c, 1c2 which protrude inward longitudinally inside the interior. Further, on the upper surface portion of the switch case 1 is provided an opening 1D, and on the bottom thereof is built-in a base 1E, In the base 1E is provided a storing concave portion 1F of the spring 3 and a deriving hole 1G of the output lead wire 5.

Figure 2:
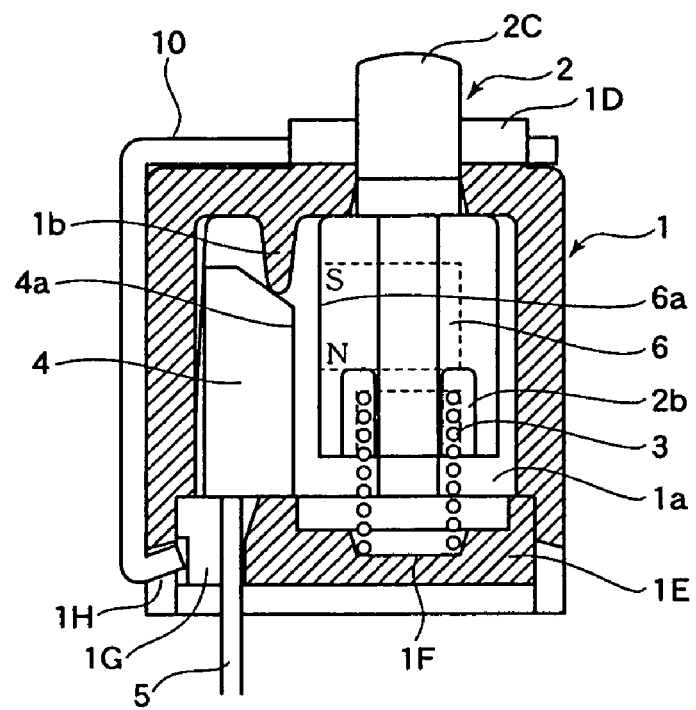
FIG. 2 is a front sectional view of the embodiment.
Figure 3:
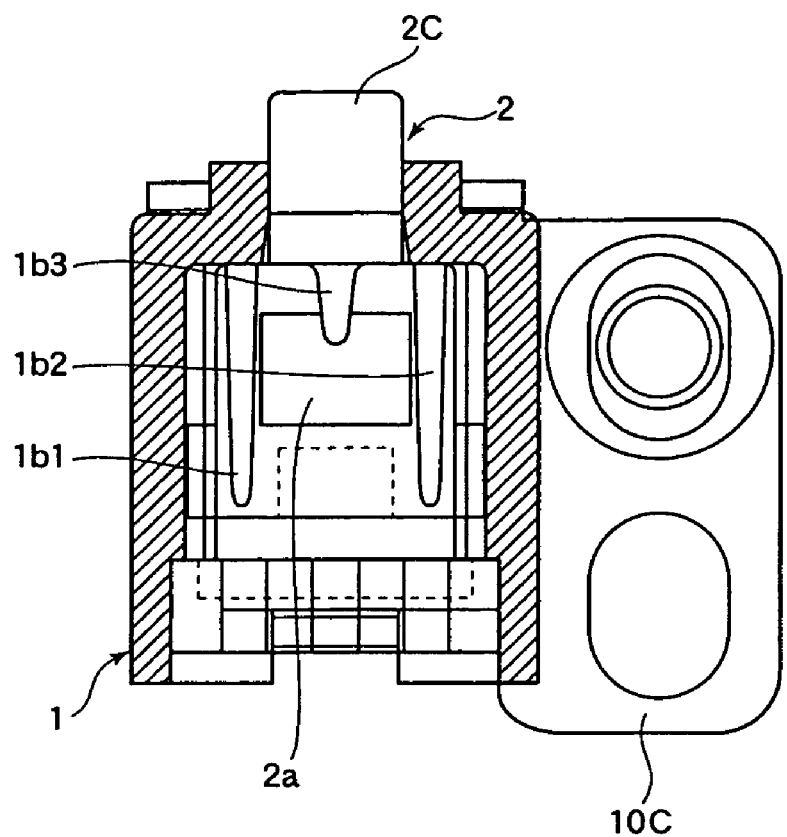
FIG. 3 is a side sectional view of the embodiment.
Figure 4:
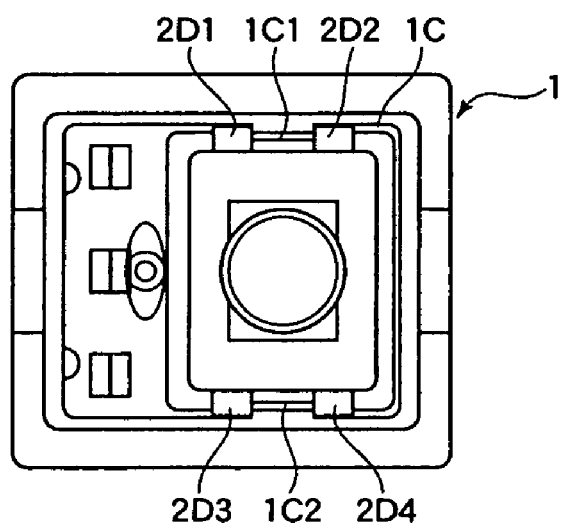
FIG. 4 is a bottom view of the embodiment.
Figure 5:
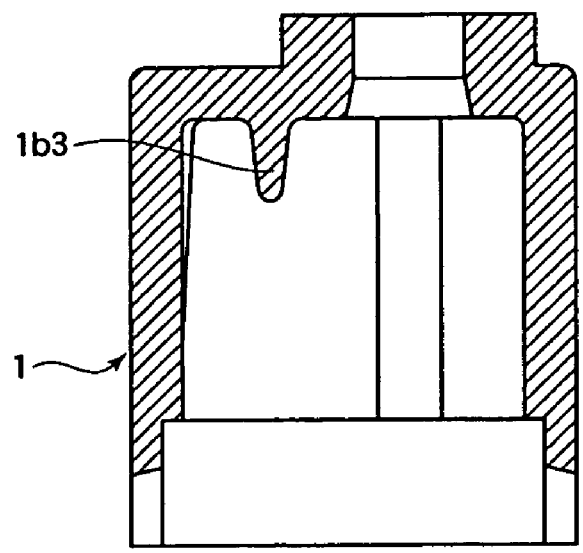
FIG. 5 is a front sectional view of a switch case in the embodiment.
Figure 6:
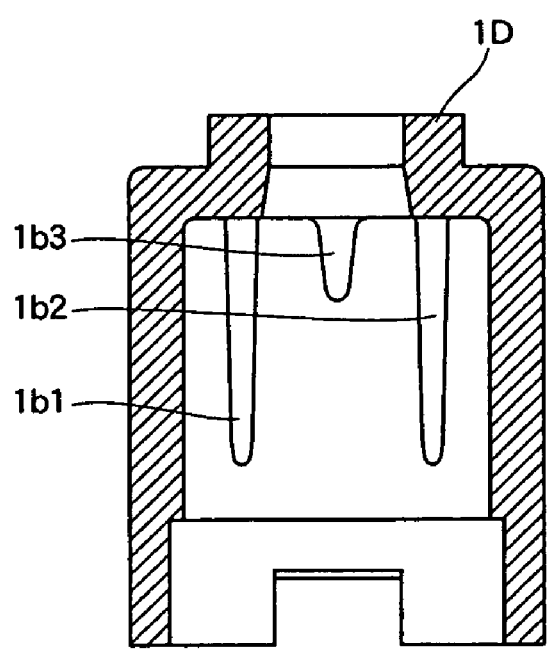
FIG. 6 is a side sectional view of the switch case.
Figure 7:
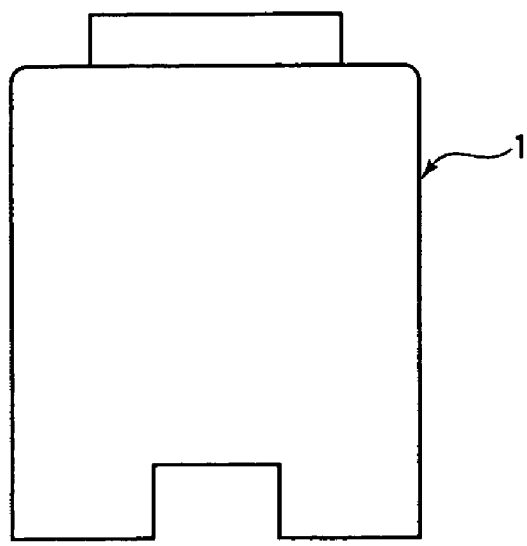
FIG. 7 is a side view of the switch case.
Figure 8:
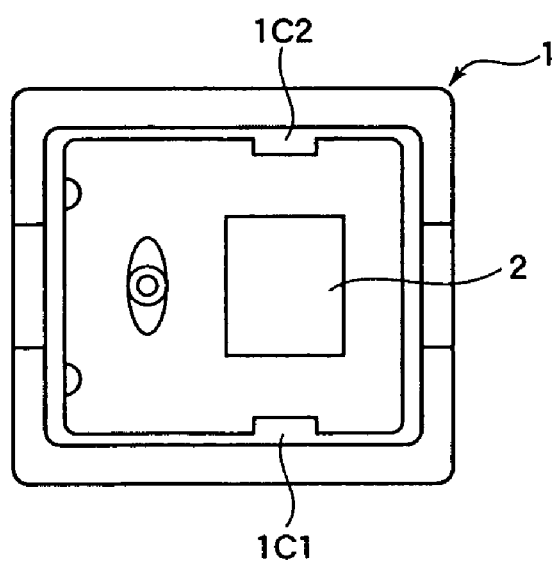
FIG. 8 is a bottom view of the switch case.

The movable member 2, as shown in FIGS. 2, 3, has a concave portion 2a to fix the magnet 6 and an upper storing chamber 2b of the spring 3. The magnet 6 is fixed to the concave portion 2a by an adhesive agent and the like.

The movable member 2, as shown in FIGS. 1 to 4, is stored inside the chamber 1a inside the switch case 1, and the upper portion of the spring 3 stored in the concave portion 1F is inserted into the interior of the storing chamber 2b so as to support the movable member 2, and in this state, an upper end portion 2c of the movable member 2 protrudes from an opening 1D of the upper surface portion of the switch case 1. A n upper portion of the movable member 2 contacts an upper area of chamber 1a of switch case 1 to retain the movable member 2 in switch case 1.

Further, in the left and right sides of the movable member 2 are formed protruding portions 2D1 to 2D4, and these protruding portions are fitted to the guide members 1c1, 1c2 of the guide portion 1c with a little clearance.

The Hall IC 4 is positioned by the positioning members 1b1 to 1b3 of the positioning portion 1b in the chamber 1a inside the switch case 1, and is mounted on the base 1E. The output lead wire 5 from the Hall IC4 is derived to the outside via the deriving hole 1G.

Due to the above-described constitution, the movable member 2 in a state of not pressing the upper end portion 2c is supported by a repelling force of the spring 3, and the upper end portion 2c protrudes from the opening 1D. At this time, a magnetic neutral point 6a of the magnet 6 is slightly above an operating point 4a of the hole IC 4. An output signal obtained in this state from the output lead wire 5 of the hole IC 4 is in an OFF state.

Next, when the upper end portion 2c is pressed, the movable member 2 moves downward, and the neutral point 6a of the magnet 6 passes through the operating point 4a of the Hall IC 4, and at tat point in time, the output signal is turned ON. By pressing or non-pressing the upper end portion 2c in this way, the output signal of the Hall IC 4 can be turned ON or OFF (or OFF or ON).

Figure 9:
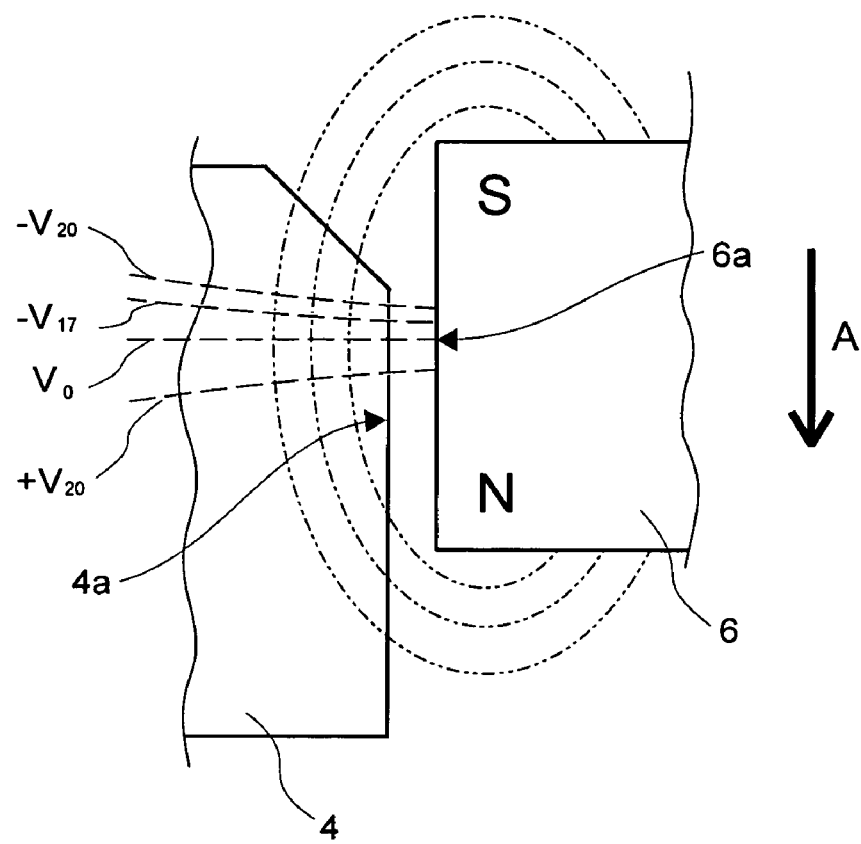
FIG. 9 shows the operation principle of the inventive switch.

Referring to FIG. 9, the switch of the invention can be activated by an operating force of only one (1) gram. The movable member 2 is in the upper position where the upper end portion 2c is not pushed. In this configuration, the operating point 4a of the hole IC 4 is just under the N-pole side isomagnetic field plane $+V_{20}$ of 20 Gauss, while the magnetic neutral point 6a of the magnet 6 is located above the plane $+V_{20}$. Isomagnetic field plane $V_0$ in which the magnetic field is zero (0) is orthogonal against the surface of the magnet 6 at the neutral point 6a The upper end portion 2c is then pushed, and the magnet 6 moves downward in the direction shown by an arrow A. When the S-pole isomagnetic field plane $-V_{20}$ of 20 Gauss passes through the operating point 4a, the hole IC 4 outputs an ON signal because its threshold from OFF state to ON state is set to magnetic field corresponding to the plane $-V_{20}$. The magnetic field is higher than 20 Gauss while the upper end portion 2c is pushed, so that the ON signal is sustained.

When the upper end portion 2c goes back to the original position, the magnetic neutral point 6a moves upward. At the moment the S-pole isomagnetic field plane $-V_{17}$ of 17 Gauss passes through the operating point 4a, the ON state of the hole IC 4 changes to OFF state because its threshold from ON state to OFF state is set to the magnetic field corresponding to the plane $-V_{17}$. Setting two kinds of thresholds like $-V_{20}$ and $-V_{17}$ prohibits self-oscillation of the hole IC.

As described above, in order to activate the switch of the invention, it is only necessary to apply a magnetic field corresponding to the threshold of the hole IC 4 to the operating point 4a, which needs little operating force, only one (1) g, because the hole IC is not attracted by the magnet. In contrast, in the case of a conventional switch employing the combination of a reed switch and a magnet, the reed switch is attracted by the magnet so that it can not be switched by such a small force. Furthermore, in the switch of the invention, the distance necessary for switching on is only several μm, but in the conventional switch employing the combination of the reed switch and the magnet, such a distance is several mm.

Figure 10:
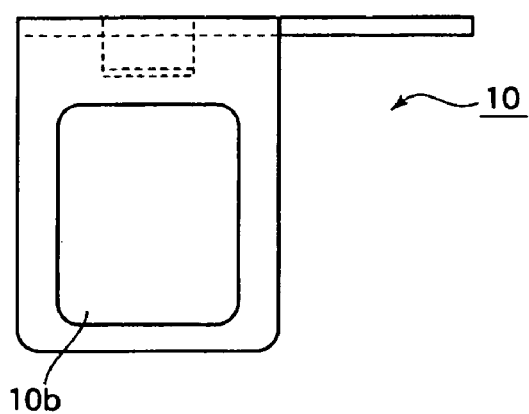
FIG. 10 is a plan view of a mounting bracket to be used to mount the switch of the invention.
Figure 11:
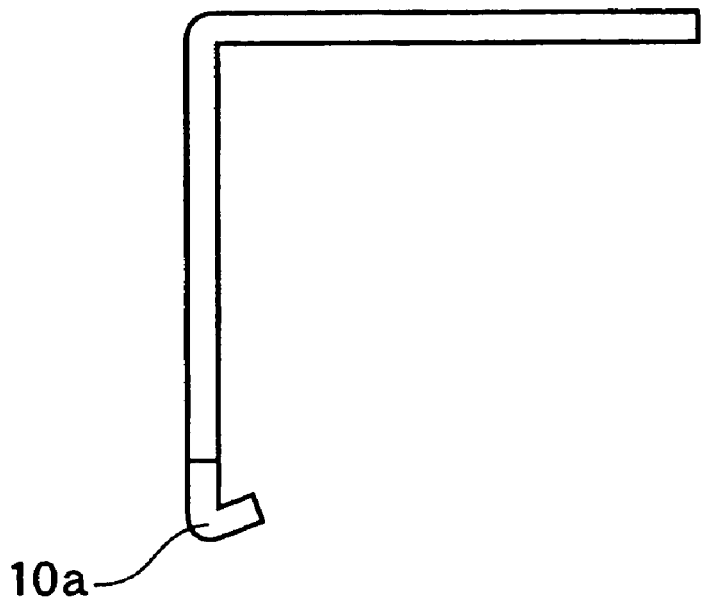
FIG. 11 is a side view of the mounting bracket.
Figure 12:
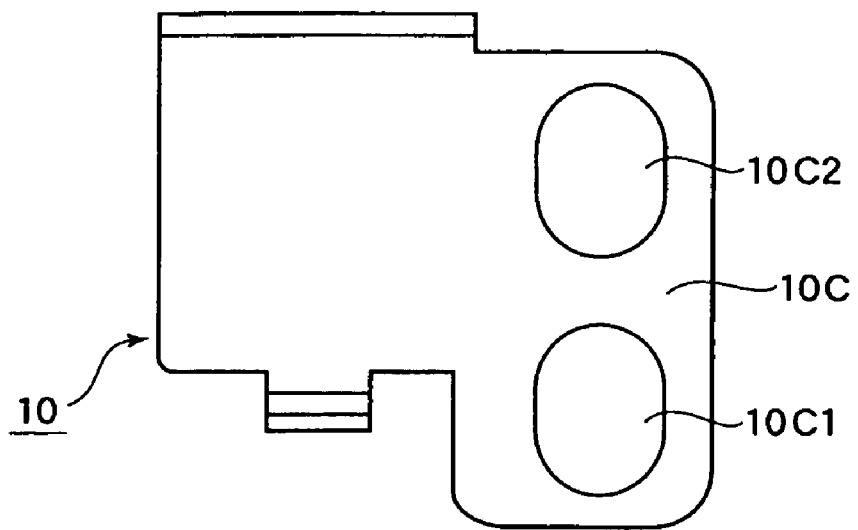
FIG. 12 is a front view of the mounting bracket.

FIGS. 10 to 12 show one example of a mounting bracket to mount the switch of the invention on a desired member as occasion demands. In the drawings, reference numeral 10 denotes a mounting bracket, reference numeral 10a, an engaging portion, reference numeral 10b, a case mounting opening portion, and reference numeral 10c, a mounting portion.

As shown in FIGS. 2 and 3, the engaging portion 10a of the mounting bracket 10 is engaged with an engaging hole 1H of the switch case 1, and the opening portion 10b is fitted to the opening 1D of the switch case 1. Mounting holes 10c1, 10c2 of the mounting portion 10c are used for screw clamping to the desired member.

Figure 13:
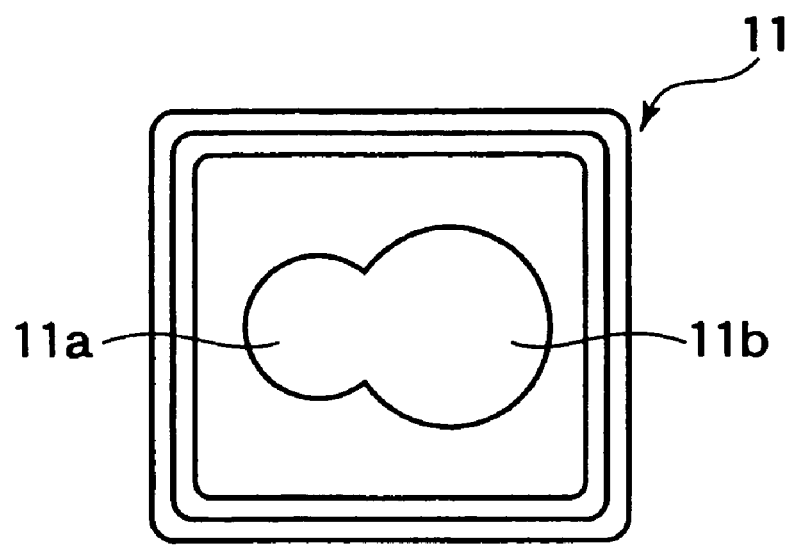
FIG. 13 is a plane view of a lid member to be used to seal the switch of the invention.
Figure 14:
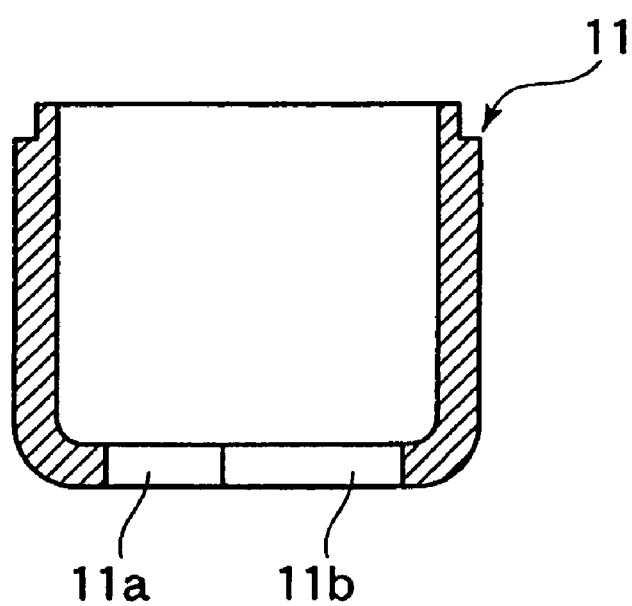
FIG. 14 is a front sectional view of the lid member.
Figure 15:
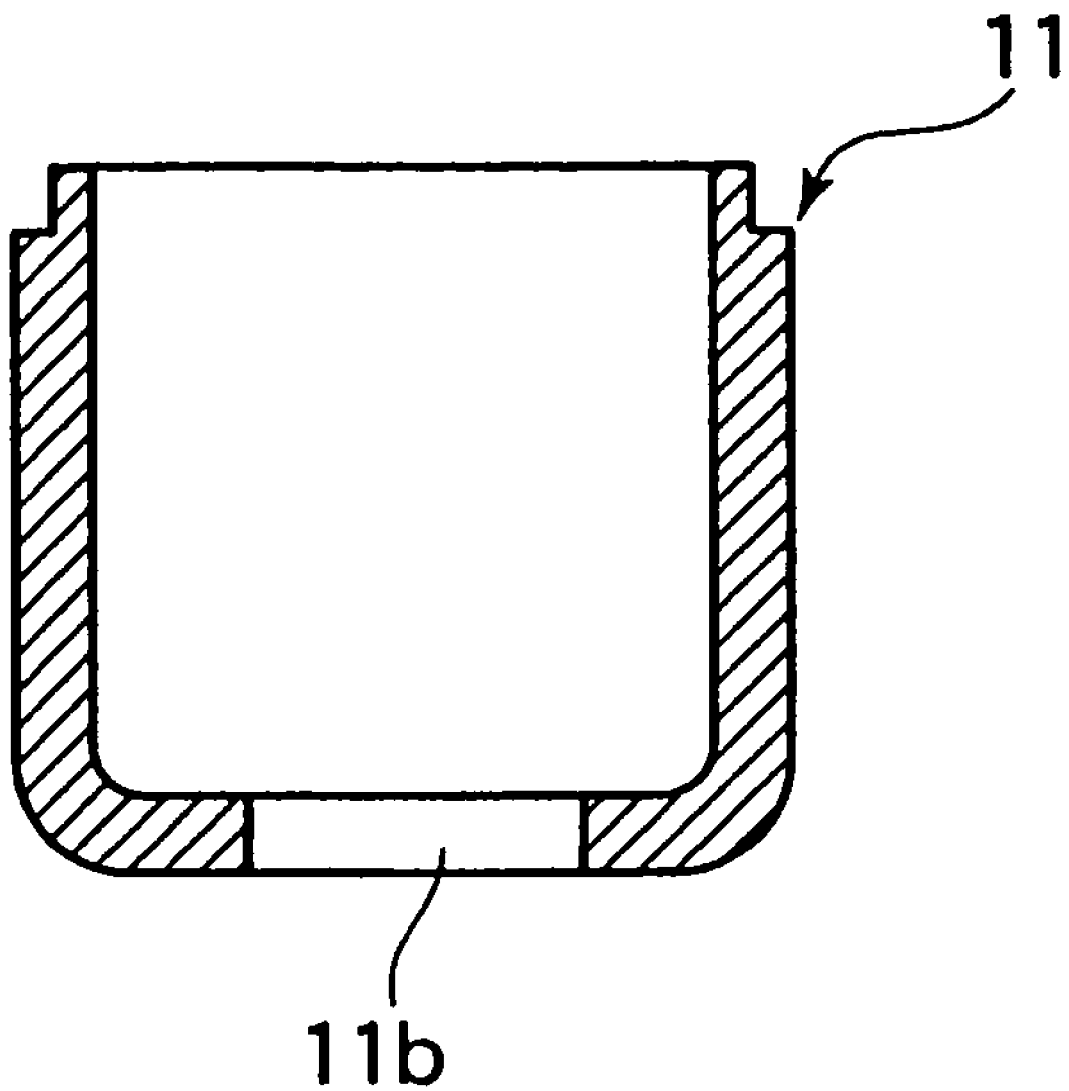
FIG. 15 is a side sectional view of the lid member.

FIGS. 13 to 15 show a lid member 11 to be fitted to the bottom of the switch case 1 as occasion demands and to seal the bottom of the switch. In the drawings, reference numeral 11a denotes a take out hole of the output lead wire 5 and reference numeral 11b denotes a hole to inject a filling agent such as silicon resin and the like. The lid member 11 is fitted to the bottom of the switch case 1, and after taking out the output lead wire 5 from the take out hole 11a, silicon resin is injected into the take out hole from the hole 11b which seals the hole.

As described above, according to the invention, an ultra compact magnetic induction switch can be constituted operable with a small operating force of about one gram level. Further, since members other than the hole IC, the magnet, and the spring can be formed by synthetic resin, a sharp reduction in costs can be achieved. Further, as an output of the hole IC, a switch output of OFF-ON or ON-OFF can be easily obtained.

What is claimed is:

1. A compact magnetic induction switch, comprising:
   a switch case (1);
   a movable member (2) provided on an opening (1D) of the switch case (1) and being reciprocally movable;
   an elastic body (3) which is installed inside the switch case (1) and urges an end portion of the movable member (2) so as to be protruded outside of the switch case (1);
   a magnet (6) fixed to the movable member (2);
   a Hall IC (4) for detecting change of magnetic field caused by movement of the movable member (2) with its operating point (4a);
   wherein if the magnet field applied to the operating point (4a) of the Hall IC becomes above or below a threshold by movement of the movable member (2), output signal of the Hall IC (4) switches on/off; and
   wherein the magnetic field threshold front an OFF state to an ON state is higher than the magnetic field threshold from an ON state to an OFF state.

2. The compact magnetic induction switch according to claim 1, wherein a positioning portion for positioning the Hall IC is provided within the switch case.

3. The compact magnetic induction switch according to claim 1, wherein a guide portion for guiding the movable member is provided within the switch case.

4. The compact magnetic induction switch according to claim 1, wherein the switch has a lid member to be fitted to a bottom of the switch case and an opening for deriving a lead wire of the Hall IC and an opening for injecting a filler are provided on the lid member.

5. The magnetic switch of claim 1, wherein said switch case, said movable member and a base member comprise a synthetic resin.

6. The magnetic switch of claim 1, said switch case including a deriving hole providing a path for an output wire connected to said Hall IC.

7. The magnetic switch of claim 1, including a lid member for fitting to a bottom of said switch case, said lid member including a take out hole providing a path through said lid member for an output wire and an injection hole.

8. The magnetic switch of claim 7, including silicon resin injected through said injection bole, said silicon resin sealing the bottom of said switch case.

9. The magnetic switch of claim 1, wherein said switch case includes an engaging hale.

10. The magnetic switch of claim 9, including a mounting bracket for mounting said switch to a desired member, said mounting bracket including a first side including an engaging portion for engagement with said engaging hole and said mounting bracket including a second side having an opening portion for receiving the end portion of said movable member projecting outwardly of said switch case.

11. The magnetic switch of claim 1, wherein when the end portion of said movable member projects outwardly of said switch case the Hall IC outputs an OFF signal and when the end portion of said movable member is depressed and moves inwardly the Hall IC outputs an ON signal.

12. The magnetic switch of claim 11, wherein an operating force of about one gram depresses said movable member and outputs an ON signal.

13. The magnetic switch of claim 1, wherein when the end portion of said movable member projects outwardly of said switch case the Hall IC outputs an ON signal and when the end portion of said movable member is depressed and moves inwardly the Hall IC outputs an OFF signal.

14. The magnetic switch of claim 13, wherein an operating force of about one gram depresses said movable member and outputs an OFF signal.

15. The magnetic switch of claim 1, wherein said end portion of said movable member extends from and is integral with part of a top end section of said movable member so that part of said top end section of said movable member contacts the switch housing to retain said movable member in said switch housing when said end portion projects outwardly of said switch case.

16. The magnetic switch of claim 1, wherein said magnet comprises a permanent magnet.

17. A compact magnetic induction switch, comprising:

a switch case (1);

a movable member (2) provided on an opening (1D) of the switch case (1) and being reciprocally movable;

an elastic body (3) which is installed inside the switch case (1) and urges an end portion of the movable member (2) so as to be protruded outside of the switch case (1);

a magnet (6) fixed to the movable member (2);

a Hall IC (4) for detecting change of magnetic field caused by movement of the movable member (2) with its operating point (4a);

wherein if the magnet field applied to the operating point (4a) of the Hall IC becomes above or below a threshold by movement of the movable member (2), output signal of the Hall IC (4) switches on/off;

wherein said switch case includes an engaging hole; and a mounting bracket for mounting said switch to a desired member, said mounting bracket including a first side including an engaging portion for engagement with said engaging hole and said mounting bracket including a second side having an opening portion for receiving the end portion of said movable member projecting outwardly of said switch case.

* * * * *

UNITED STATES PATENT AND TRADEMARK OFFICE
CERTIFICATE OF CORRECTION

PATENT NO. : 7,068,132 B2
APPLICATION NO. : 10/783261
DATED : June 27, 2006
INVENTOR(S) : Yukihiro Asa It is certified that error appears in the above-identified patent and that said Letters Patent is hereby corrected as shown below:

Title page at (75) Inventor: Delete "Yuhikiro" Asa and substitute --Yukihiro-- Asa.

Claim 9 Line 16: After "engaging", delete "hale" and substitute --hole--.

Signed and Sealed this

Seventeenth Day of October, 2006

JON W. DUDAS
*Director of the United States Patent and Trademark Office*

UNITED STATES PATENT AND TRADEMARK OFFICE
CERTIFICATE OF CORRECTION

PATENT NO. : 7,068,132 B2
APPLICATION NO. : 10/783261
DATED : June 27, 2006
INVENTOR(S) : Yukihiro Asa It is certified that error appears in the above-identified patent and that said Letters Patent is hereby corrected as shown below:

In the Specification:

Column 1, line 27 replace "hole" with --Hall--.

Column 1, line 28 replace "hole" with --Hall--.

Column 1, line 33, replace "hole" with --Hall--.

Column 1, line 37 replace "hole" with --Hall--.

Column 1, line 39 replace "hole" with --Hall--.

Column 1, line 41 replace "hole" with --Hall--.

Column 1, line 42 replace "hole" with --Hall--.

Column 1, line 66 replace "hole" with --Hall--.

Column 2, line 2, replace "hole" with --Hall--.

Column 2, line 3, replace "hole" with --Hall--.

Column 2, line 6, replace "hole" with --Hall--.

Column 2, line 13, replace "hole" with --Hall--.

Column 2, line 46, replace "hole" with --Hall--.

Column 3, line 17, replace "hole" with --Hall--.

Column 3, line 23, replace "hole" with --Hall--.

Column 3, line 25, replace "hole" with --Hall--.

Column 3, line 37, replace "hole" with --Hall--.

Column 3, line 46, replace "hole" with --Hall--.

Column 3, line 56, replace "hole" with --Hall--.

UNITED STATES PATENT AND TRADEMARK OFFICE
CERTIFICATE OF CORRECTION

PATENT NO. : 7,068,132 B2
APPLICATION NO. : 10/783261
DATED : June 27, 2006
INVENTOR(S) : Yukihiro Asa It is certified that error appears in the above-identified patent and that said Letters Patent is hereby corrected as shown below:

Column 3, line 60, replace "hole" with --Hall--.

Column 3, line 63, replace "hole" with --Hall--.

Column 3, line 65, replace "hole" with --Hall--.

Column 4, line 33, replace "hole" with --Hall--.

Column 4, line 36, replace "hole" with --Hall--.

Signed and Sealed this

Thirtieth Day of January, 2007

JON W. DUDAS
*Director of the United States Patent and Trademark Office*